ELECTROLESS NICKEL PLATING PROCESS

Filed April 1. 1971

INVENTORS
James L. Bachman &
BY Robert M. Martin
Barnard, McGlynn & Reising
ATTORNEYS United States Patent Office 3,736,167
Patented May 29, 1973

3,736,167

ELECTROLESS NICKEL PLATING PROCESS

James L. Bachman and Robert M. Martin, Golden, Colo., assignors to Coors Porcelain Company, Golden, Colo.

Filed Apr. 1, 1971, Ser. No. 130,132
Int. Cl. B44d *1/20*
U.S. Cl. 117—37 R 5 Claims

ABSTRACT OF THE DISCLOSURE

A method for nickel plating ceramic parts having refractory-metalized areas wherein a thin, possibly discontinuous, coating of nickel is placed on the part by burnishing or tumbling. Thereafter, the part is electrolessly plated with a eutectic nickel-phosphorous composition. The coated parts are heated until the composition melts and runs off of only the ceramic, having the refractory-metalized areas uniformly nickel plated regardless of area.

This invention relates to plating and particularly to a process for nickel plating metalized areas of ceramic and ceramic-like parts.

It is well known that nickel when electrolytically plated creates an internal stress pattern which becomes more severe as the plating builds up. Thus, it is seldom if ever that one can satisfactorily nickel plate a part such as a ceramic substrate having two or more discrete portions of different areas to be plated. Because the plating thickness is a function of the area to be plated, the large area portions often plate too much while the smaller area portions are plated properly. Because of the stress factor, the large area portions become overstressed and, generally, break away from the ceramic substrate. One solution to this problem, of course, is to individually plate the various areas but the multistep techniques which are required to accomplish this are totally incompatible with mass production situations.

Accordingly, the present invention has for its principal objective the development of a process for uniformly plating metalized areas of a ceramic part without creating overstressed areas which may separate from the ceramic sublayer. In general, the process which is afforded by the subject invention involves applying a first thin coating of conductive metal, such as nickel, to the part to permit initiation of the following step of electroless plating. This step is typically accomplished by a tumbling process wherein nickel powder or pellets are caused to burnish the surface of the ceramic part so as to leave thin metal spots on the ceramic and possibly on the metalized areas. The next step in the subject process is to electrolessly plate a coating of a nickel-phosphorous compound having substantially a eutectic transition characteristic, thus, to have a relatively low melting point. The final step in the process is to heat the part, typically in a reducing atmosphere to prevent oxidation, to alloy and melt away the base metal and the nickel-phosphorous coatings, thus, permitting these coatings to run off of the unmetalized ceramic area while wetting the metalized areas. The part is then cooled such that the nickel forms a bright, durable, conductive coating of uniform thickness over only the metalized layers.

The subject method finds greatest utility when applied to the nickel plating of parts having an area or areas of ceramic or ceramic-like material which are not to be plated and areas of refractory-metalized composition which are to be planted, these metalized areas existing in various sizes which, if electrolytically coated, would result in a plating of varying thickness.

Figure 1:
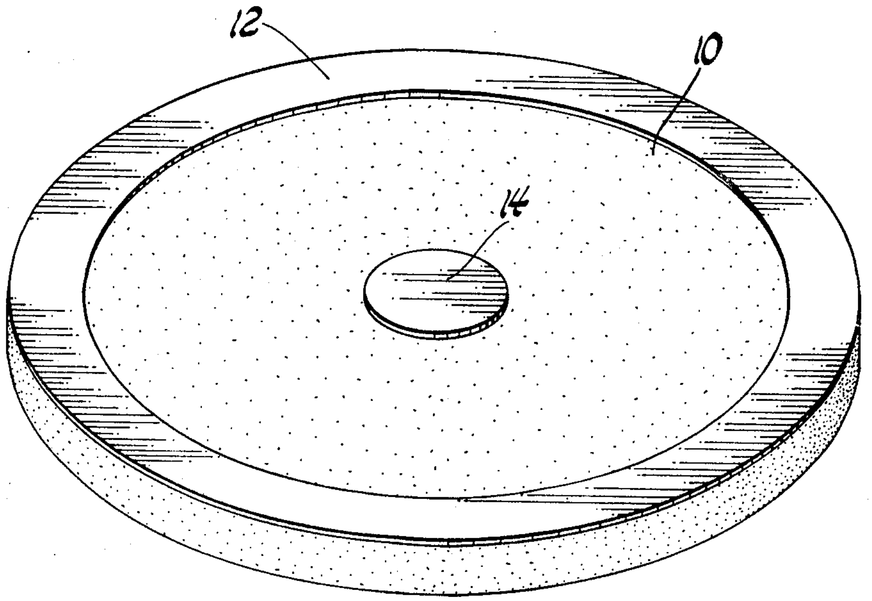
Figure 2:
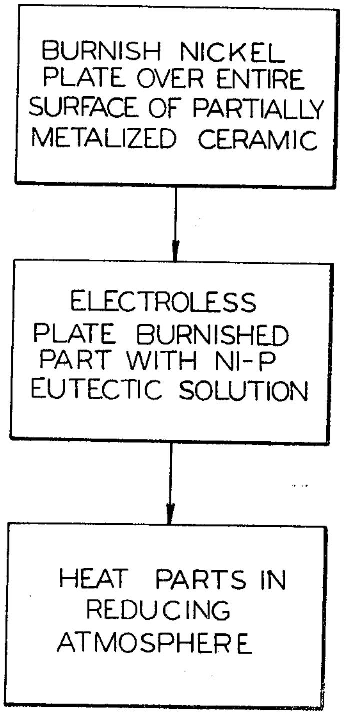

The various features and advantages of the subject invention will be best understood by a reading of the following specification which sets forth a specific example of the invention in detail. This specification is to be taken with the accompanying drawing of which:

FIG. 1 is a perspective view of a typical part which may be advantageously plated using the subject invention; and, FIG. 2 is a flow chart of the subject process.

Referring now to FIG. 1, there is shown a dense, ceramic disc 10 having deposited thereon a relatively large metalized area 12 in the form of a ring and a relatively small metalized area 14 in the form of a centrally located dot. The areas 12 and 14 are electrically separate and isolated from one another and are disposed on the ceramic disc 10 for the purpose of making electrical connections between various areas of an integrated circuit device (not shown) which might be secured to the disc 10. Disc 10 is typically made from a high alumina ceramic and the metallized areas are typically a molybdenum-manganese composition which is screened onto the disc 10 in paste form. Metalizing compositions containing tungsten and other metals may also be used. The ceramic disc 10 with the metalized areas 12 and 14 is fired at a temperature of aproximately 1600° C. to produce a hard, smooth surface part. It is to be understood that the illustration of a disc and the illustration of a ring and a dot of metalized material are illustrative only and that other parts of other geometries may be advantageously plated using the method hereinafter described.

It is desirable to plate a conductive material such as nickel or a high nickel alloy over the metalized areas 12 and 14. If an electrolytic plating process were used to plate a high nickel alloy over the ring area 12 and the dot area 14, the part would emerge from the electrolytic bath with the plating on ring area 12 being thicker and, thus, more highly stressed than the plating on dot area 14. Under many circumstances, to obtain a plating on dot area 14 of the proper thickness, the plating on ring area 12 becomes overstressed and normally separates both the nickel plating and the metalization thereunder from the ceramic disc 10.

In accordance with the present invention, a uniform and relatively unstressed nickel plating is disposited on the ring area 12 and the dot area 14 by the method hereinafter described in detail. First a small quantity of pure, or nearly pure, nickel metal is placed on the disc 10. The operation which is believed to be most expeditious for accomplishing this step is a burnishing operation which is accomplished by loading a large number of the ceramic discs 10 having the metalized areas thereon into a mill along with a particulate material and powdered or finely pelletized nickel. After a large number of the parts have been tumbled for a short time, the parts emerge from the mill with a large number of thin, bright spots or specks of nickel relatively uniformly deposited over both the exposed ceramic surface of the disc 10 and the metalized areas 12 and 14. This thin coat may be continuous or discontinuous with no effect on the following steps. As an alternative to the burnishing operation, a thin nickel "strike" plate may be electrolytically plated on the part in a conventional manner. It has been found that even a scribe mark of pure nickel metal will produce satisfactory results in many cases.

The next step as indicated in FIG. 2 is to immerse a part which has been burnished as set forth above, or preferably again a large number of such parts, in electroless nickel plating bath containing a nickel-phosphorous solution wherein the nickel content is approximately 88% to 94% by weight and the phosphorous content is approximately 6% to 12% by weight. As will be recognized by those skilled in the metallurgy art, such a nickel-phosphorous compound has a eutectic temperature characteristic; which is to say the solid to liquid transition or melting temperature of the nickel-phosphorous composition is significantly less than the melting temperature of either nickel or phosphorous alone. The melting temperature of pure nickel is approximately 1450° C. which is so high that if the metalized disc 10 were subjected to such temperature the metalized areas 12 and 14 would be decomposed. However, the eutectic composition has a melting temperature of approximately 875° C. which is so low as to be quite safe with respect to the preservation of the metalized areas.

As will also be recognized by those of ordinary skill in the art, the operation of electrolessly plating nickel on a ceramic is well known. Electroless plating materials and directions for use in plating alumina ceramics are available, for example, from Enthone Incorporated of New Haven, Conn.

The next step in the process for mass producing the ceramic disc 10 with the nickel-plated areas 12 and 14 is to place the burnished and then electrolessly plated parts face up and unstacked in a furnace. It is preferable to tilt the parts slightly and to avoid disposing them one over top of another such that when the temperature of the furnace is brought to approximately 880° C. or to some temperature in the range between 870° C. and 1150° C. as is required to combine the metal of the initiating coating with the electrolessly plated coating and to convert the nickel phosphorous alloy to a liquid state. The melted composition along with the now alloyed and combined original burnished coating runs off of the ceramic leaving a clean ceramic surface but wets the metalized areas 12 and 14. The wetted areas, of course, remain coated with the melted nickel such that when the parts are cooled below the melting temperature of the nickel-phosphorous composition, a uniformly thick plating of nickel is left on the ring 12 and the dot 14. However, no nickel remains on the ceramic annulus between these two areas. Where the parts are not tilted, the melted nickel alloy "balls up" on the ceramic and is easily brushed off when cool.

It is to be understood that the foregoing description is illustrative with respect to certain details and is, thus, not to be construed in a limiting sense.

The embodiments of the invention in which an exclusive property or privilege is claimed are defined as follows:

1. A method for uniformly plating only the metalized areas of a selectively metalized ceramic part comprising the steps of: depositing a pattern of a refractory metalizing material on the part; firing the metalized part; mechanically applying at least one thin area of pure nickel on the surface of the part to initiate electroless plating; electrolessly plating over the entire part a second coating of a nickel-phosphorous compound containing about 6% to 12% phosphorous and having a melting temperature lower than the temperature at which the fired metalized area decomposes; and thereafter heating the part in a reducing atmosphere to alloy and melt the nickel and nickel-phosphorous coating, the step of heating the part being carried out at a temperature which is higher than the melting temperature of the nickel-phosphorous compound, but lower than the decomposition temperature of the fire metalized area so as to remove by melting and running off the nickel and nickel-phosphorous coatings from the unmetalized areas of the ceramic part.

2. A method as defined in claim 1 wherein the part is heated to a temperature between 870° C. and 1150° C.

3. A method as defined in claim 1 wherein the part is oriented substantially face up to fully expose the metalized areas prior to the heating step.

4. A method as defined in claim 1 wherein the part has a least two metallized areas of unequal size.

5. A method as defined in claim 1 wherein the heating step involves placing the part in a nonhorizontal orientation in a furnace such that the melted alloy runs off of the ceramic surface having the metalized portions.

References Cited

UNITED STATES PATENTS

| | | | |
|---|---|---|---|
| 3,607,389 | 9/1971 | Canegallo | 117—213 X |
| 3,554,793 | 1/1971 | Kreiger | 117—217 X |
| 3,401,057 | 9/1968 | Eckert et al. | 117—213 X |
| 3,586,534 | 6/1971 | Nitta et al. | 117—213 |
| 3,577,276 | 5/1971 | Edge | 117—213 |
| 3,522,086 | 7/1970 | Edge | 117—213 |
| 3,621,567 | 11/1971 | Hasegawa et al. | 117—217 X |

WILLIAM D. MARTIN, Primary Examiner

B. D. PIANALTO, Assistant Examiner

U.S. Cl. X.R.

117—50, 54, 62, 71 R, 102 M, 123 B, 130 E, 212, 213, 217